(12) United States Patent  
Della Fiora et al.

(10) Patent No.: US 7,782,632 B2  
(45) Date of Patent: Aug. 24, 2010

(54) ELECTRICAL POWER CONNECTION WITH TWO POWER CONNECTORS ON A MODULE IN AN ELECTRONIC SYSTEM

(75) Inventors: Troy A. Della Fiora, Spring, TX (US); Gregory L. Gibson, The Woodlands, TX (US); David W. Sherrod, Tomball, TX (US); John R. Grady, Cypress, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 816 days.

(21) Appl. No.: 11/641,243

(22) Filed: Dec. 19, 2006

(65) Prior Publication Data

US 2007/0279892 A1 Dec. 6, 2007

(51) Int. Cl.
*H02B 1/20* (2006.01)
(52) U.S. Cl. .................. 361/826; 361/600; 361/727; 361/733; 29/825; 439/638
(58) Field of Classification Search .......... 361/826, 361/600, 727, 733; 439/638; 29/825
See application file for complete search history.

(56) References Cited

U.S. PATENT DOCUMENTS

| | | | | |
|---|---|---|---|---|
| 4,846,699 A | * | 7/1989 | Glover et al. ............. 439/64 |
| 4,869,673 A | * | 9/1989 | Kreinberg et al. ............. 439/64 |
| 5,089,937 A | * | 2/1992 | Carrubba et al. ............. 361/732 |
| 5,455,490 A | * | 10/1995 | Callahan et al. ............. 315/194 |
| 5,737,194 A | * | 4/1998 | Hopkins et al. ............. 361/800 |
| 6,105,088 A | * | 8/2000 | Pascale et al. ............. 710/100 |
| 6,563,714 B2 | * | 5/2003 | Chang ............. 361/752 |
| 6,748,474 B1 | * | 6/2004 | Caldara et al. ............. 710/301 |
| 6,796,843 B1 | * | 9/2004 | Ryan et al. ............. 439/638 |
| 6,927,974 B2 | * | 8/2005 | Robillard et al. ......... 361/679.4 |
| 6,977,821 B2 | * | 12/2005 | Aguinaga et al. ............. 361/788 |
| 7,080,343 B2 | * | 7/2006 | Asai et al. ............. 716/15 |
| 7,238,046 B2 | * | 7/2007 | Chou et al. ............. 439/541.5 |
| 2002/0090846 A1 | * | 7/2002 | Abboud ............. 439/76.1 |
| 2003/0030328 A1 | * | 2/2003 | Tamai et al. ............. 307/82 |
| 2005/0101184 A1 | * | 5/2005 | Chang et al. ............. 439/564 |
| 2005/0254210 A1 | * | 11/2005 | Grady et al. ............. 361/695 |
| 2007/0237472 A1 | * | 10/2007 | Aronson et al. ............. 385/101 |

\* cited by examiner

*Primary Examiner*—Tuan T Dinh
*Assistant Examiner*—Xiaoliang Chen (57) ABSTRACT

When a module is inserted into a bay of an electronic system, an electrical signal connector on the electronic system engages a mating signal connector on the module and an electrical power connector on the electronic system engages one of two mating power connectors on the module. The electrical power connector on the electronic system is on either a first side or a second side of the electrical signal connector. The mating power connectors are on the first and second sides of the mating signal connector on the module.

15 Claims, 7 Drawing Sheets

Fig. 12 ics, such as computers and many other devices, be easy to use, manipulate, handle or work with physically. Such ease of physical handling enables quick and efficient assembly, disassembly and maintenance of these electronic systems. Such speed and efficiency reduces the associated time and cost for these activities. For example, modular components of larger overall systems may be made to be simply plugged into and pulled out of the system. In this manner, the physical configuration of the system can be changed quickly and easily.

ELECTRICAL POWER CONNECTION WITH TWO POWER CONNECTORS ON A MODULE IN AN ELECTRONIC SYSTEM

RELATED APPLICATION

This application claims the benefit of U.S. Provisional Application No. 60/809,444 filed on May 30, 2006, which is entirely incorporated herein by reference.

BACKGROUND

It is generally preferred that some electronic systems, such as computers and many other devices, be easy to use, manipulate, handle or work with physically. Such ease of physical handling enables quick and efficient assembly, disassembly and maintenance of these electronic systems. Such speed and efficiency reduces the associated time and cost for these activities. For example, modular components of larger overall systems may be made to be simply plugged into and pulled out of the system. In this manner, the physical configuration of the system can be changed quickly and easily.

To enable the quick and easy plugging and unplugging of a module in an electronic system, the system generally has an electrical connector mounted inside the system in an appropriate location and manner. The module generally has a mating electrical connector that engages the electrical connector in the system when the module is fully inserted into the system. The module communicates with the rest of the electronic system and receives electrical power through the connector.

For situations involving relatively large power requirements and/or relatively large numbers of communication signals, separate connectors may be used for the communication signals and for electrical power within the system and on the module. In this case, the separate connectors must be mounted relative to each other with tolerances that allow the connectors in the system to accurately align with the connectors on the module, so the module can be easily plugged into the overall system.

Some systems have several of the same or similar modules, e.g. installed in bays within the systems. In this case, it is preferable for all of these modules to have the same upside orientation, i.e. none should be sideways or upside down. In this manner, confusion is prevented with respect to additional features, such as the proper installation of cables, the correct function of buttons and the right meaning of LEDs on an externally exposed side of the module. For situations having separate connectors for communication signals and electrical power, the two connectors must be placed with the same orientation relative to each other in every bay, so that the modules have to be inserted with the same orientation in every bay.

However, many industries, such as electronics and computers, have a need to continually put more functionality into a smaller space. As a result, compromises regarding the placement of physical components sometimes have to be made. Thus, there is a problem when the connectors for communication signals and electrical power cannot be placed with the same orientation relative to each other in every bay.

DETAILED DESCRIPTION

Figure 1:
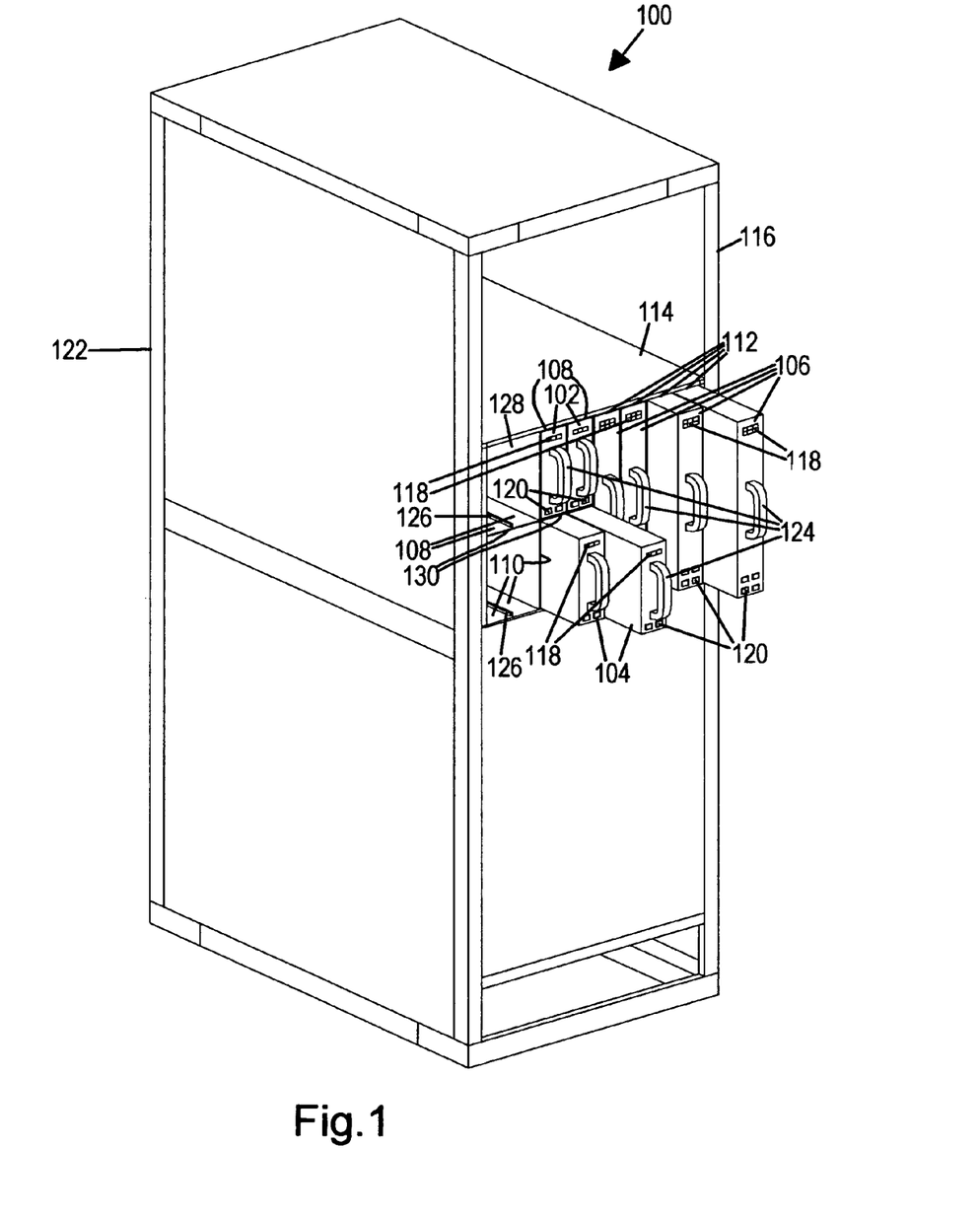
FIG. 1 is a perspective view of an exemplary electronic system incorporating an embodiment of the present invention.

An exemplary electronic system 100 incorporating an embodiment of the present invention is shown in FIG. 1 generally having one or more modules 102, 104 and 106. The modules 102, 104 and 106 are inserted in bays 108, 110 and 112, respectively, of a module support chassis 114 that is mounted in a rack 116. The modules 102-106 are shown with a number of optional output indicators (e.g. LEDs 118) and input keys (e.g. buttons 120). The LEDs 118 and buttons 120 illustrate that the modules 102-106 have the same upside orientation, even though signal and power connectors, described below, near a back end 122 of the rack 116 do not all have the same orientation relative to each other in every bay 108-112.

The modules 102-106 may be computers, "blade" servers, storage devices, communications devices, entertainment devices or combinations thereof, among other appropriate electronic devices. Some of the modules 102-106 are shown fully inserted into the support chassis 114. Others of the modules 102-106 are shown partially extended out of the support chassis 114 for illustrative purposes. The modules 102-106 have a handle 124, which a user may grasp to pull the modules 102-106 out of the support chassis 114 and to push the modules 102-106 into the support chassis 114.

The bays 108-112 are generally defined side-to-side by guide rails 126 and side walls 128. The modules 102-106 generally slide between the guide rails 126 and side walls 128. (See also FIG. 2.)

The bays 112 extend almost the full height of the support chassis 114. The modules 106 that fit in the full-height bays 112 also extend almost the full height of the support chassis 114.

The bays 108 and 110, on the other hand, extend about half the height of the support chassis 114. The half-height bays 108 and 110 are shown divided into upper bays 108 and lower bays 110 by an optional dividing shelf 130. The modules 102 and 104 that fit in the upper and lower half-height bays 108 and 110 also extend about half the height of the support chassis 114.

The full-height bays 112 can be converted into half-height bays 108 and 110 by inserting a dividing shelf 130 therein. Additionally, adjacent half-height bays 108 and 110 can be combined into full-height bays 112 by removing the dividing shelf 130 from between them.

Figure 2:
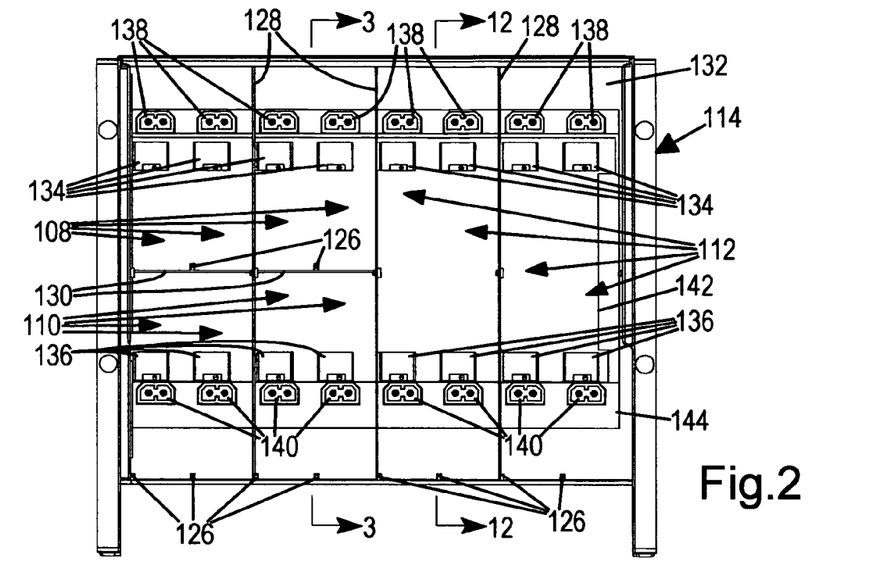
FIG. 2 is a front view of a group of bays for use in the exemplary electronic system shown in FIG. 1 according to an embodiment of the present invention.

Near an interior back wall or side 132 of the support chassis 114, as shown in FIG. 2, each bay 108-112 has an electrical communication signal connector 134 and 136 and an electrical power connector 138 and 140. In the embodiment shown, upper power connectors 138 are located above upper signal connectors 134, and lower power connectors 140 are located below lower signal connectors 136. In other words, the upper signal and power connectors 134 and 138 are not oriented relative to each other in the same manner as the lower signal and power connectors 136 and 140 are oriented relative to each other.

In the embodiment shown, vertically aligned signal connectors 134 and 136 are between corresponding vertically aligned power connectors 138 and 140. This arrangement is due to the signal connectors 134 and 136 being mounted on a signal plane 142 (e.g. a single printed circuit board). Signal traces and other components on the signal plane 142 leave no available space on the signal plane 142, so the power connectors 138 and 140 are restricted to being on the "outside" of the perimeter of the signal plane 142 in this embodiment.

In the embodiment shown, the power connectors 138 and 140 are mounted on a power plane 144. (See also FIG. 3.) The signal plane 142 is in front of the power plane 144, and both 142 and 144 are attached to the back wall 132 of the support chassis 114.

Figure 3:
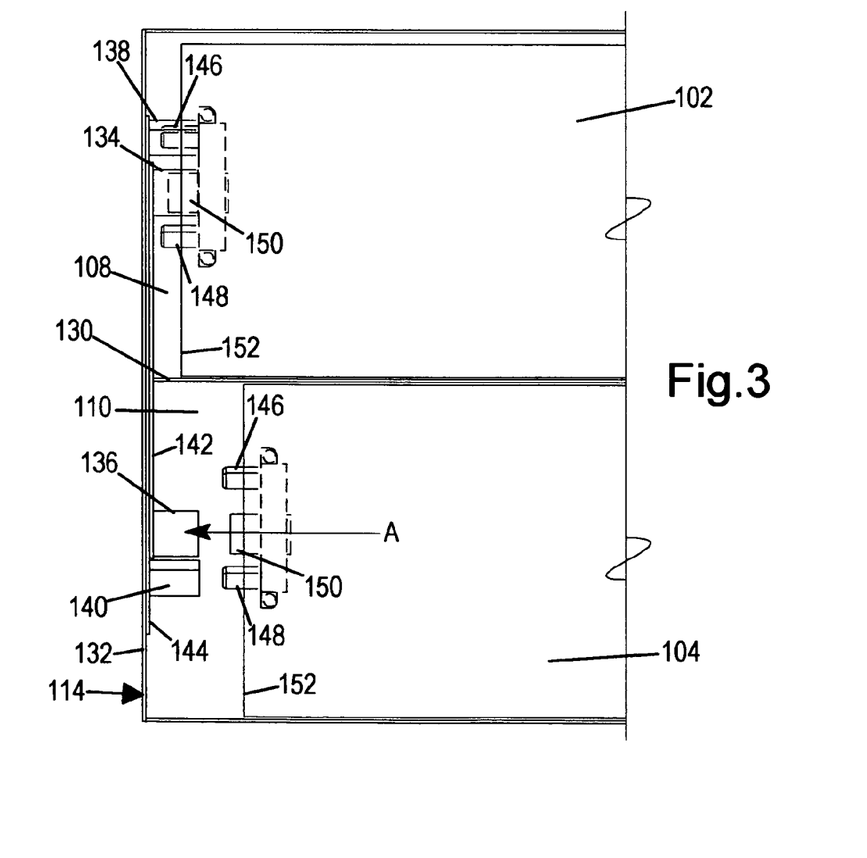
FIG. 3 is a simplified cross section view taken along section line 3-3 in FIG. 2 of two half-height bays with two modules for use in the exemplary electronic system shown in FIG. 1 according to an embodiment of the present invention.

Two of the modules 102 and 104 are shown in FIG. 3 inserted in the upper and lower bays 108 and 110, respectively. The module 102 is fully inserted in the upper bay 108, and the module 104 is only partially inserted in the lower bay 110.

Each module 102 and 104 has two power connectors 146 and 148 and a signal connector 150 exposed at a back end 152 thereof. The signal connector 150 is between the power connectors 146 and 148. The power connectors 146 and 148 are the same or similar to each other. The power connectors 146 and 148 in the modules 102 and 104 match and can mate with the power connectors 138 and 140 in the bays 108 and 110 in a board-to-board type connection. Likewise, the signal connectors 150 in the modules 102 and 104 match and can mate with the signal connectors 134 and 136 in the bays 108 and 110.

In the fully inserted position of module 102, the power connector 146 and the signal connector 150 are mated with the power connector 138 and the signal connector 134, respectively, in the upper bay 108. The other power connector 148 of the module 102, on the other hand, is not mated with anything in this case.

In the partially inserted position of module 104, there is no power or signal connection between the module 104 and the power and signal connectors 140 and 136 in the lower bay 110. To make the power and signal connections, the insertion of the module 104 into the lower bay 110 is completed by moving the module 104 in the direction of arrow A. Whereupon, the power connector 148 and the signal connector 150 of the module 104 mate with the power connector 140 and the signal connector 136 in the lower bay 110 in a "blind-mate" type function. The other power connector 146 of the module 104, on the other hand, will not mate with anything in this case.

The modules 102 and 104 are designed to fit in any of the upper or lower half-height bays 108 and 110. The presence of two power connectors 146 and 148 enable the modules 102 and 104 to be inserted with the same upside orientation into any one of the upper and lower bays 108 and 110.

In an alternative embodiment, the power connectors 138 and 140 are placed between the signal connectors 134 and 136 in the bays 108-112. In another alternative embodiment, the modules 102 and 104 have two signal connectors 150 placed on opposite sides of a single power connector 146 or 148, and only one of the signal connectors 150 mates with the matching signal connector 134 or 136 when the module 102 or 104 is inserted in one of the bays 108 or 110. Still other embodiments may combine embodiments shown and/or described herein.

Figure 4:
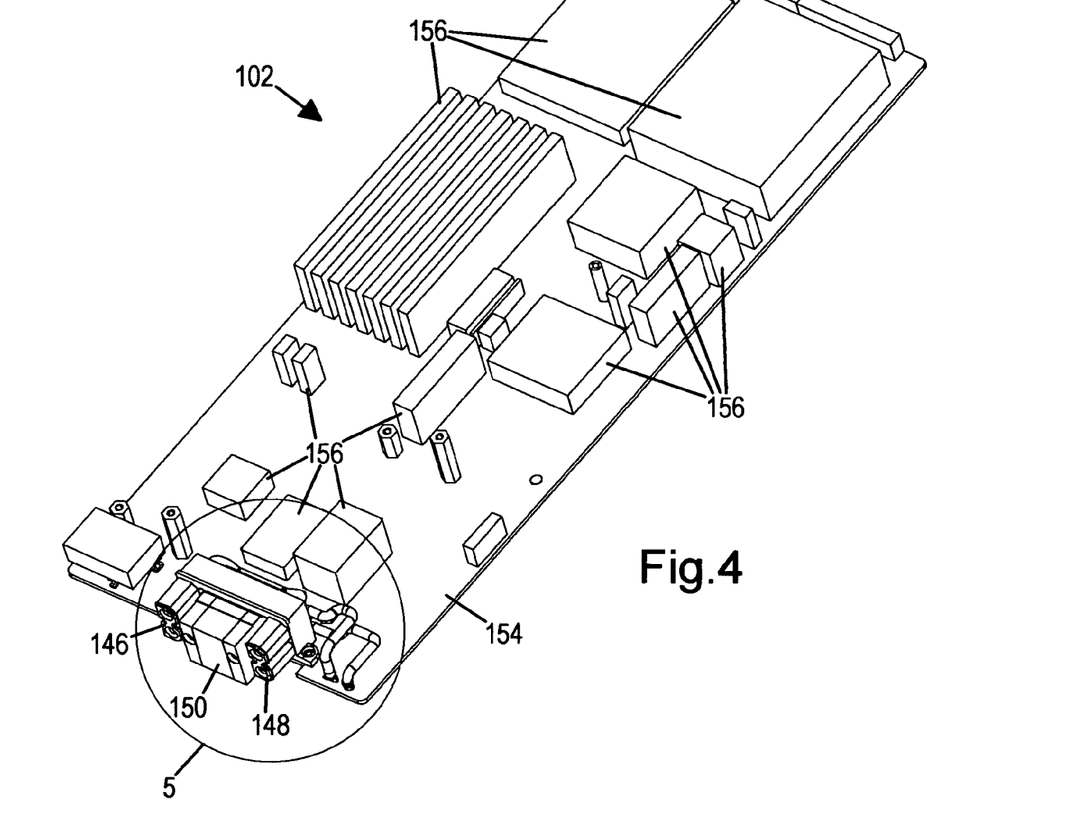
FIG. 4 is a simplified perspective view of an inside of an exemplary module for use in the exemplary electronic system shown in FIG. 1 according to an embodiment of the present invention.
Figures 5, 6:
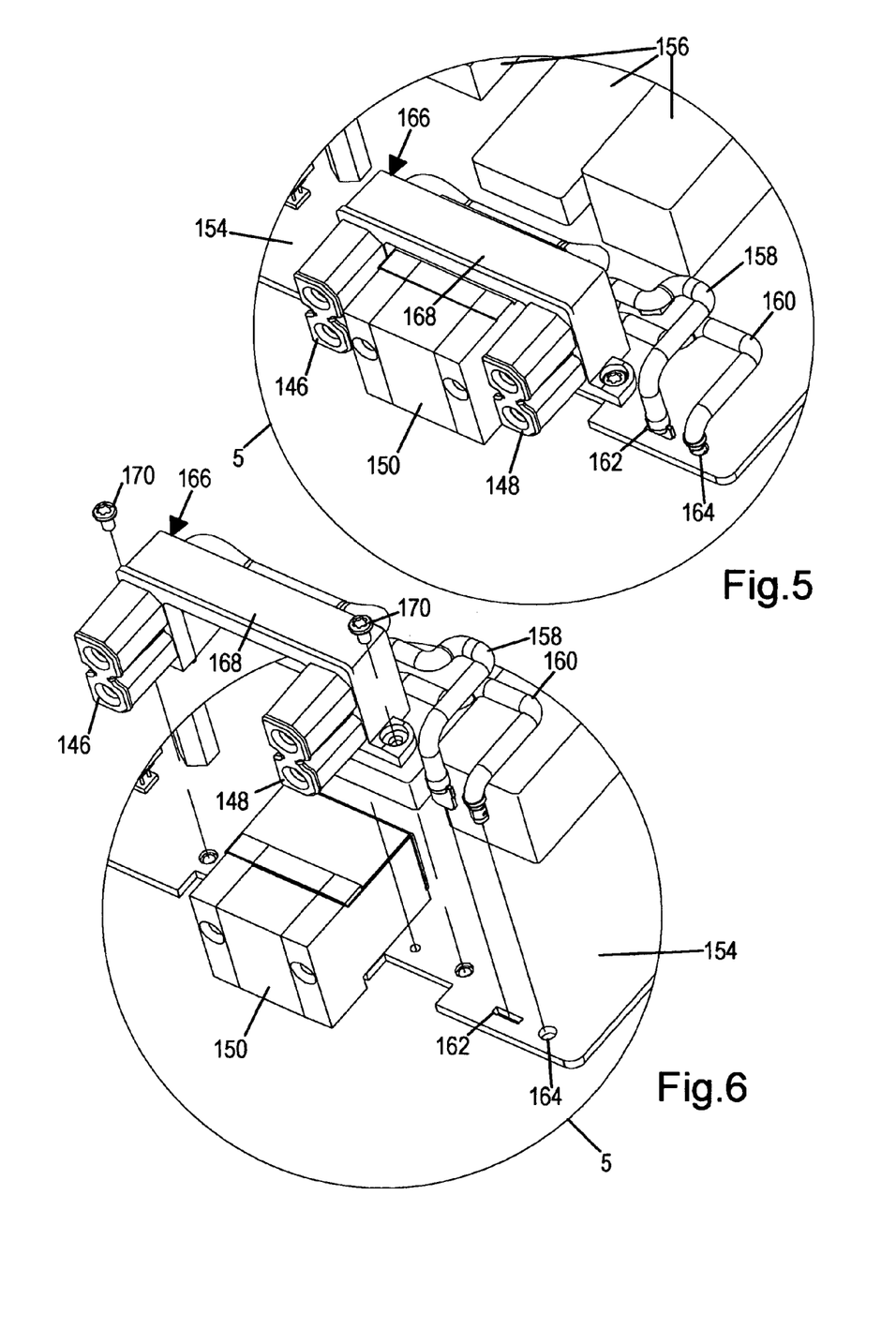
FIG. 5 is a simplified perspective view of an enlargement of a portion 5 of the exemplary module shown in FIG. 4 according to an embodiment of the present invention.
FIG. 6 is a simplified perspective view of a partially exploded drawing of the portion 5 of the exemplary module shown in FIG. 5 according to an embodiment of the present invention.

According to the embodiment shown, the module 102 (and 104), as shown in FIGS. 4, 5 and 6, generally has a printed circuit board 154 on which the signal connector 150, the power connectors 146 and 148 and a variety of other electronic components 156 are mounted. Additionally, the power connectors 146 and 148 generally have power wires 158 and 160 that extend to power receptacles 162 and 164, respectively, on the printed circuit board 154. Also, according to this embodiment, the power connectors 146 and 148 are generally formed integrally as a single power connector unit 166 with a "bridge" 168 between the power connectors 146 and 148.

The bridge 168 overlays the signal connector 150. Thus, the power connector unit 166 effectively surrounds the signal connector 150 when mounted (e.g. with screws 170) on the printed circuit board 154.

Figure 7:
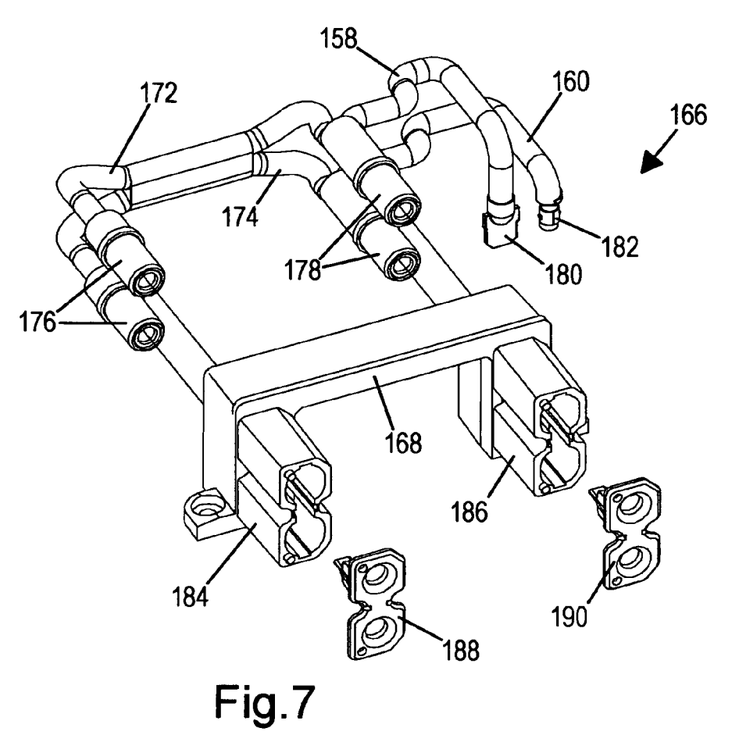
FIG. 7 is a simplified perspective view of an exploded drawing of an electrical power connector unit for use in the exemplary module shown in FIG. 4 according to an embodiment of the present invention.
Figure 8:
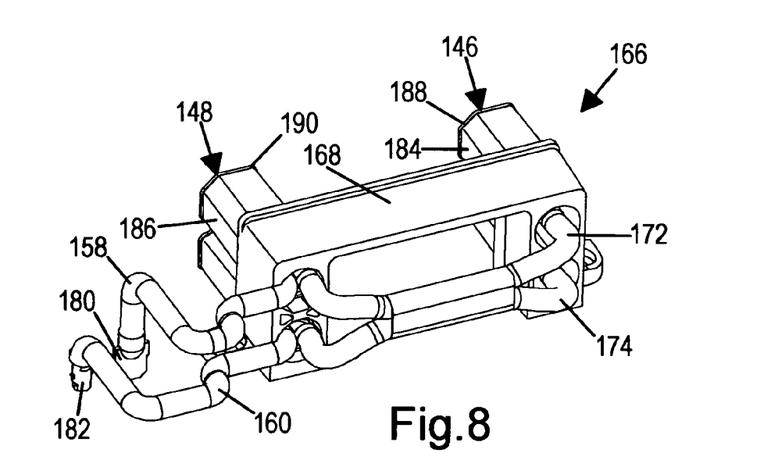
FIG. 8 is an alternative simplified perspective view of the electrical power connector unit shown in FIG. 7 according to an embodiment of the present invention.
Figure 9:
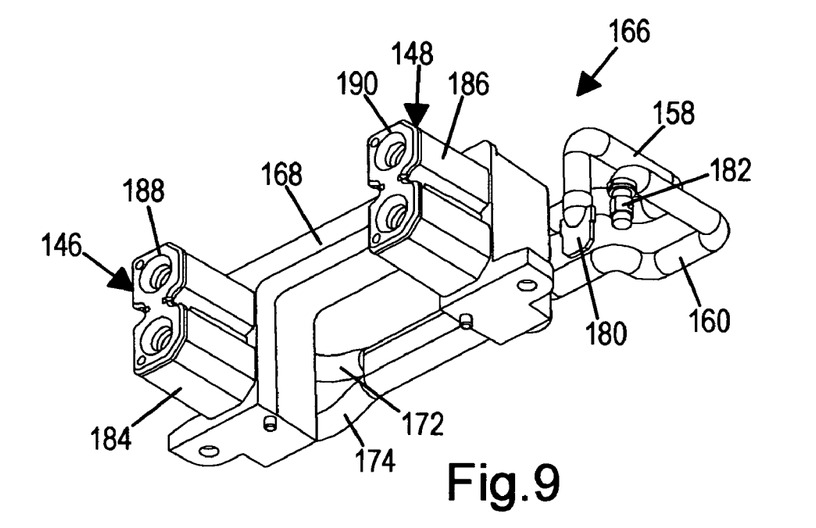
FIG. 9 is another alternative simplified perspective view of the electrical power connector unit shown in FIG. 7 according to an embodiment of the present invention.

In addition to the power wires 158 and 160 and the bridge 168, the power connector unit 166 generally includes, as shown in FIGS. 7, 8 and 9, power wires 172 and 174, female electrical barrel connectors 176 and 178, end wire lugs 180 and 182, female electrical connector housings 184 and 186 and end caps 188 and 190, in accordance with the embodiment shown. The connector housings 184 and 186, the end caps 188 and 190 and the barrel connectors 176 and 178 form the power connectors 146 and 148, respectively. The connector housings 184 and 186 and the bridge 168 are formed as a single unit, e.g. molded plastic. The end caps 188 and 190 (e.g. molded plastic) attach onto a front face of the connector housings 184 and 186, respectively. The power wires 172 and 174 electrically connect the barrel connectors 176 and 178 together (positive to positive and negative to negative). The power wires 158 and 160 electrically connect the barrel connectors 178 to the lugs 180 and 182. The lugs 180 and 182 are connected to the power receptacles 162 and 164, respectively, on the printed circuit board 154 (FIGS. 5 and 6). The barrel connectors 176 and 178 are inserted into and fixed inside the connector housings 184 and 186, respectively, wherein they receive male connector pins in the power connectors 138 and 140 when the module 102 or 104 is inserted into the bay 108 or 110 (FIGS. 2 and 3).

Figure 10:
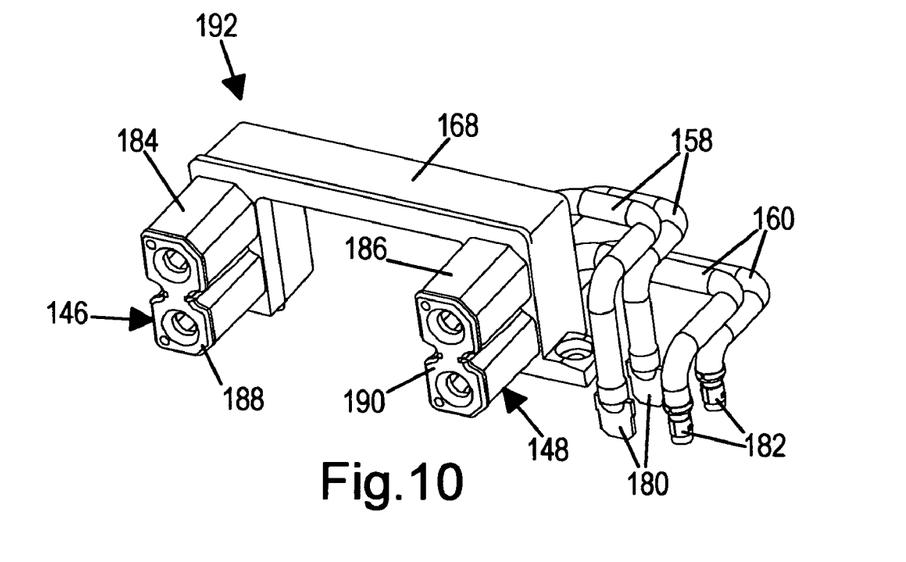
FIG. 10 is a simplified perspective view of an alternative electrical power connector unit for use in the exemplary electronic system shown in FIG. 1 according to an embodiment of the present invention.
Figure 11:
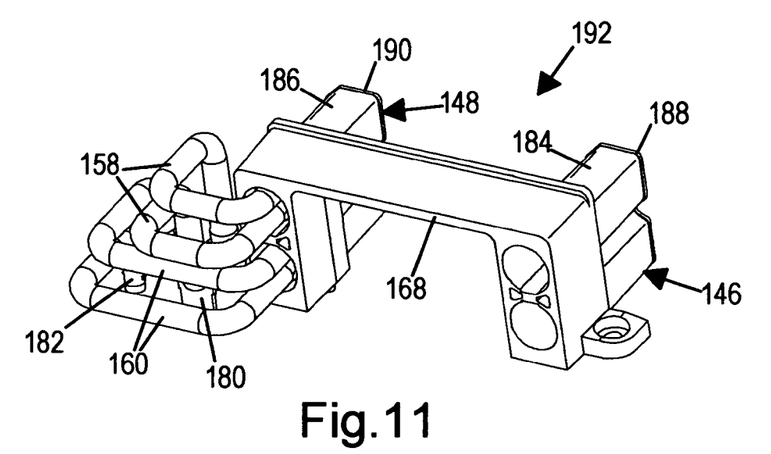
FIG. 11 is an alternative simplified perspective view of the alternative electrical power connector unit shown in FIG. 10 according to an embodiment of the present invention.

According to an alternative embodiment, only one of the power connectors 146 and 148 in a power connector unit 192 is used, as shown in FIGS. 10 and 11. In the particular embodiment shown, only the power connector 148 is used. (Alternatively, the power connector 146 is used, and the power connector 148 is unused.) Therefore, the used power connector 148 includes its connector barrels 178 as described above, and the unused power connector 146 does not need its connector barrels 176. Additionally, the power wires 158 and 160 electrically connect the used power connector 148 to the lugs 180 and 182, respectively. In this particular embodiment, two of each of the power wires 158 and 160 and two of each of the lugs 180 and 182 are used. Thus, this particular embodiment illustrates a situation in which a larger amount of electrical power can be sent through the power connector 148 than in previous embodiments, while still using the same power wires 158 and 160 as before.

Figure 12:
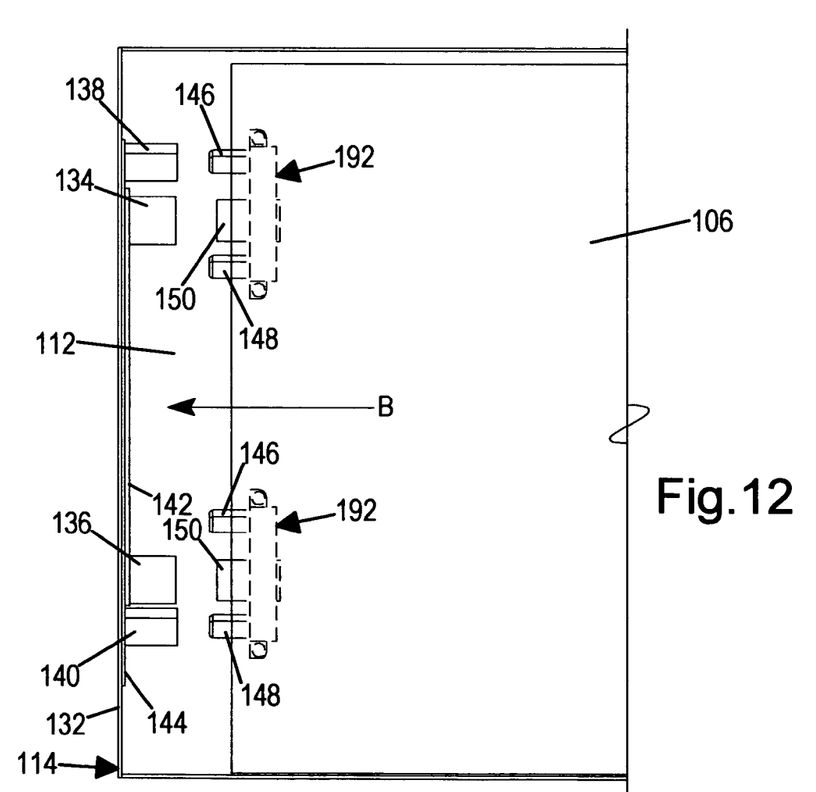
FIG. 12 is a simplified cross section view taken along section line 12-12 in FIG. 2 of one full-height bay with one module for use in the exemplary electronic system shown in FIG. 1 according to an embodiment of the present invention.

The power connector unit 192 may be used in the full-height modules 106 (FIG. 1), as shown in FIG. 12. (The module 106 is shown partially inserted into the bay 112, and can be fully inserted by moving the module 106 in the direction of arrow B until the power connectors 146 and 148 and the signal connectors 150 engage the power connectors 138 and 140 and signal connectors 134 and 136.) The modules 106 do not necessarily need to have a power connector unit with two power connectors, since the modules 106 have to be inserted into the full-height bays 112, instead of the half-height bays 108 or 110. However, since parts of the power connector unit 192 are the same as or similar to parts of the power connector unit 166, a manufacturer of half-height and full-height modules 102-106 can use the power connector unit 192 in the full-height modules 106 in order to minimize the total number of parts to keep in inventory.

Additionally, the full-height module 106 has the upper and lower signal connectors 134 and 136 and the upper and lower power connectors 138 and 140 available in the full-height bay 112. Therefore, the module 106 may use the upper signal and power connectors 134 and 138, the lower signal and power connectors 136 and 140 or both, depending on the overall power and signal requirements for the module 106. If the lower power connector 140 is used, then the mating power connector 148 of the lower power connector unit 192 is electrically connected, as shown in FIGS. 10 and 11. On the other hand, if the upper power connector 138 is used, then the mating power connector 146 of the upper power connector unit 192 is electrically connected.

We claim:

1. A module for use in an electronic system, comprising:
a signal connector that can engage a matching signal connector in the electronic system by sliding the module into a bay of the electronic system until the signal connector engages the matching signal connector;
first and second power connectors located on first and second sides, respectively, of the signal connector to engage a matching power connector located on either the first or second side of the matching signal connector when the module is slid into the bay;
wherein, when the matching power connector is located on the first side of the matching signal connector, the first power connector engages the matching power connector and the second power connector does not engage with a power connector in the electronic system; and
wherein, when the matching power connector is located on the second side of the matching signal connector, the second power connector engages the matching power connector and the first power connector does not engage with a power connector in the electronic system.

2. A module as defined in claim 1, wherein:
the first and second power connectors are integral in a single unit.

3. A module as defined in claim 2, wherein:
the single unit further comprises a bridge between and integral with the first and second power connectors.

4. A module as defined in claim 3, further comprising:
a circuit board on which the signal connector and the single unit of the power connectors are mounted with the bridge overlaying the signal connector.

5. A module as defined in claim 2, wherein:
the single unit partially surrounds the signal connector.

6. A module as defined in claim 1, wherein:
electrical power can be supplied to either of the first and second power connectors of the module to provide the electrical power to the module.

7. An electronic system comprising:
first and second electrical signal connectors mounted on an interior side of the electronic system; and
first and second electrical power connectors mounted on the interior side of the electronic system with the electrical signal connectors between the electrical power connectors;
wherein the electrical signal and power connectors can receive modules that can be inserted into the electronic system, each module having a mating signal connector and first and second mating power connectors;
wherein, when the mating signal connector is aligned with the first electrical signal connector, the first mating power connector is aligned with the first electrical power connector and the second mating power connector is not aligned with either of said first and second electrical power connectors; and
wherein, when the mating signal connector is aligned with the second electrical signal connector, the second mating power connector is aligned with the second electrical power connector and the first mating power connector is not aligned with either of said first and second electrical power connectors.

8. An electronic system as defined in claim 7, wherein:
the first and second electrical power connectors can supply electrical power to either of the first and second mating power connectors of the module to provide the electrical power to the module.

9. An electronic system as defined in claim 7, further comprising:
first and second arrays of the electrical signal connectors; and
first and second arrays of the electrical power connectors, the arrays of the electrical signal connectors arranged between the arrays of the electrical power connectors;
and wherein each module that has its mating signal connector aligned with one of the electrical signal connectors in the first array of electrical signal connectors also has its first mating power connector aligned with one of the electrical power connectors in the first array of electrical power connectors, and each module that has its mating signal connector aligned with one of the electrical signal connectors in the second array of electrical signal connectors also has its second mating power connector aligned with one of the electrical power connectors in the second array of electrical power connectors.

10. An electronic system as defined in claim 9, wherein:
the electronic system comprises upper and lower bays into which the modules can be inserted, each bay has one of the electrical signal connectors and one of the electrical power connectors disposed therein, each upper bay has a given arrangement of the electrical signal connector and electrical power connector relative to each other, each lower bay has a reverse of the given arrangement of the electrical signal connector and electrical power connector relative to each other;

the modules inserted in the upper bays have a given upside orientation; and the modules inserted in the lower bays have the same given upside orientation.

11. An electronic system as defined in claim 9, further comprising:

upper and lower bays into which the modules can be inserted, each bay having one of the electrical signal connectors and one of the electrical power connectors disposed therein, each upper bay having a given arrangement of the electrical signal connector and electrical power connector relative to each other, each lower bay having a reverse of the given arrangement of the electrical signal connector and electrical power connector relative to each other.

12. An electronic system as defined in claim 7, wherein:

the electrical signal and power connectors can receive another module for which the aforementioned mating signal connector is a first mating signal connector;

the other module further comprises a second mating signal connector; and when the first mating signal connector of the other module is aligned with the first electrical signal connector, the first mating power connector, the second mating signal connector and the second mating power connector of the other module are aligned with the first electrical power connector, the second electrical signal connector and the second electrical power connector, respectively.

13. A method for installing a module in an electronic system, comprising:

inserting the module into a bay of the electronic system;

engaging an electrical signal connector on the electronic system with a mating signal connector on the module by completing the inserting;

engaging an electrical power connector on the electronic system with one of a first and second mating power connector on the module by the completing of the inserting, the electrical power connector being on either a first side or a second side of the electrical signal connector, and the first and second mating power connectors being on the first and second sides, respectively, of the mating signal connector;

wherein, when the electrical power connector is located on the first side of the electrical signal connector, said engaging comprises engaging the first mating power connector with the electrical power connector and not engaging the second mating power connector with a power connector in the electronic system; and wherein, when the electrical power connector is located on the second side of the electrical signal connector, said engaging comprises engaging the second mating power connector with the electrical power connector and not engaging the first mating power connector with a power connector in the electronic system.

14. A method as defined in claim 13, wherein the aforementioned electrical signal connector, electrical power connector, bay and module are a first electrical signal connector, a first electrical power connector, a first bay and a first module, respectively, and further comprising:

inserting a second module into a second bay of the electronic system, the second bay being in vertical alignment with the first bay, the first and second modules having a same given upside orientation;

engaging a second electrical signal connector on the electronic system with a mating signal connector on the second module by completing the inserting of the second module; and engaging a second electrical power connector on the electronic system with one of a first and second mating power connector on the second module by the completing of the inserting of the second module, the second electrical power connector being on an opposite side of the second electrical signal connector as the first electrical power connector is of the first electrical signal connector, and the first and second mating power connectors of the second module being on the first and second sides, respectively, of the mating signal connector of the second module.

15. An electronic system into which a module can be inserted, comprising:

first and second means for exchanging electrical signals with the module; and first and second means for transmitting electrical power to the module, with the first and second electrical power transmitting means between the first and second electrical signal exchanging means;

and wherein:

the module has first and second means for mating with the first and second electrical power transmitting means;

the first mating means aligns with the first electrical power transmitting means and the second mating means does not align with an electrical power transmitting means in the electronic system when the module aligns with the first electrical signal exchanging means; and the second mating means aligns with the second electrical power transmitting means and the first mating means does not align with an electrical power transmitting means in the electronic system when the module aligns with the second electrical signal exchanging means.

* * * * *

UNITED STATES PATENT AND TRADEMARK OFFICE
CERTIFICATE OF CORRECTION

PATENT NO. : 7,782,632 B2  Page 1 of 1
APPLICATION NO. : 11/641243
DATED : August 24, 2010
INVENTOR(S) : Troy A. Della Fiora et al.

It is certified that error appears in the above-identified patent and that said Letters Patent is hereby corrected as shown below:

On the title page, below item (65), in column 1, line 1,
insert -- Related U.S. Application Data
(60) Provisional application No. 60/809,444, filed on May 30, 2006. --.

Signed and Sealed this
Nineteenth Day of July, 2011

David J. Kappos
*Director of the United States Patent and Trademark Office*